(12) United States Patent
Koyanagi

(10) Patent No.: US 6,486,814 B2
(45) Date of Patent: Nov. 26, 2002

(54) DIGITAL-TO-ANALOG CONVERTER USING DIFFERENT MULTIPLICATORS BETWEEN FIRST AND SECOND PORTIONS OF A DATA HOLDING PERIOD

(75) Inventor: Yukio Koyanagi, Urawa (JP)

(73) Assignee: Yasue Sakai, Urawa (JP)

( * ) Notice: Subject to any disclaimer, the term of this patent is extended or adjusted under 35 U.S.C. 154(b) by 0 days.

(21) Appl. No.: 09/890,519

(22) PCT Filed: Dec. 15, 2000

(86) PCT No.: PCT/JP00/08899
§ 371 (c)(1),
(2), (4) Date: Jul. 31, 2001

(87) PCT Pub. No.: WO01/45266
PCT Pub. Date: Jun. 21, 2001

(65) Prior Publication Data
US 2002/0158785 A1 Oct. 31, 2002

(30) Foreign Application Priority Data
Dec. 17, 1999 (JP) .......................................... 11-359892

(51) Int. Cl.[7] .................................................. H03M 1/66
(52) U.S. Cl. ..................................................... 341/144
(58) Field of Search ................................ 341/144, 153, 341/147

(56) References Cited

U.S. PATENT DOCUMENTS

| 4,167,731 | A   |   | 9/1979 | Eggermont ................. 341/144 |
| 5,014,304 | A   | * | 5/1991 | Nicollini et al. ............ 379/399 |
| 5,307,064 | A   | * | 4/1994 | Kudoh ........................ 341/144 |
| 6,252,533 | B1  | * | 6/2001 | Tafuru ........................ 341/144 |
| 6,295,014 | B1  | * | 9/2001 | Eastty et al. ................ 341/143 |

FOREIGN PATENT DOCUMENTS

| JP | 64-047113 | 2/1989 |
| JP | 4-61509   | 2/1992 |
| WO | 99/38090  | 7/1999 |

* cited by examiner

*Primary Examiner*—Peguy Jeanpierre
(74) *Attorney, Agent, or Firm*—Dellett and Walters

(57) ABSTRACT

It is object to provide a digital-to-analog converter capable of generating an output waveform having less distortion without increasing the operating speed of components. A D/A converter comprises four D flip-flops 10-1 through 10-4, four multipliers 12-1 through 12-4, three adders 14-1 through 14-3, a D/A converter 16, and two integrating circuits 18-1 and 18-2. Input data is fed sequentially to the four D flip-flops and held therein. The multiplier multiplies the data held in the respective D flip-flops by different multiplicators in the first half and second half of one clock period and the multiplication results are added by the three adders. A stepwise analog voltage corresponding to the sum is generated by the D/A converter 16 and integrated twice by means of the two integrating circuits 18-1 and 18-2.

14 Claims, 11 Drawing Sheets

F/G. 1
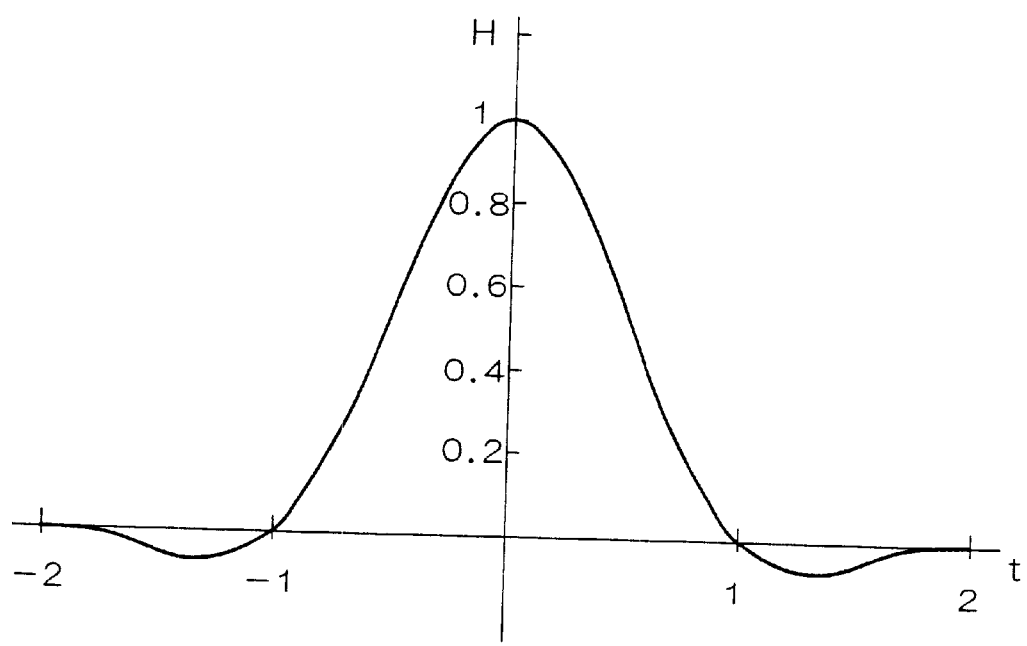
F/G. 2
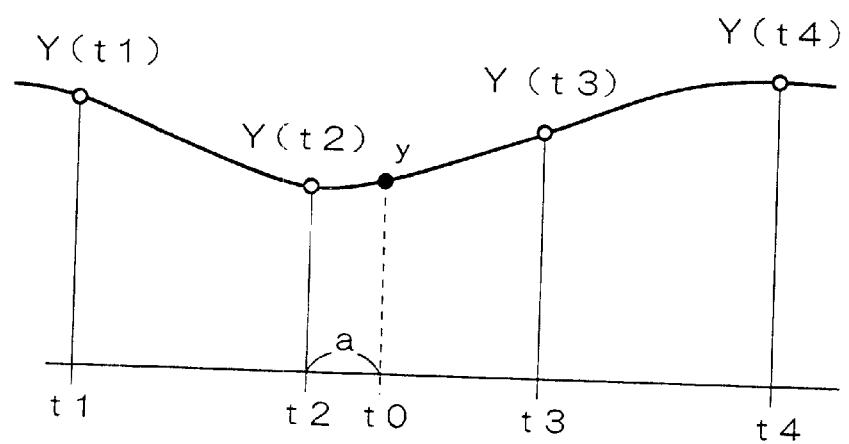

FIG. 7A
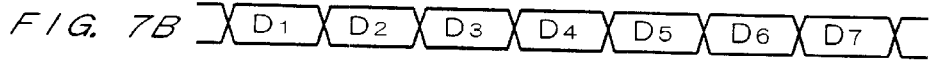
FIG. 7B
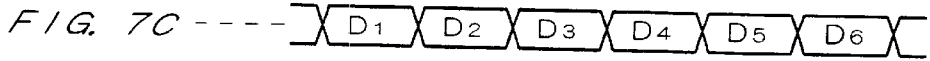
FIG. 7C
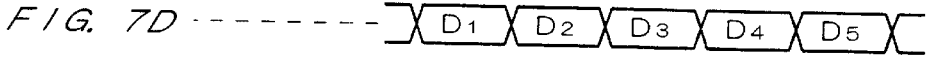
FIG. 7D
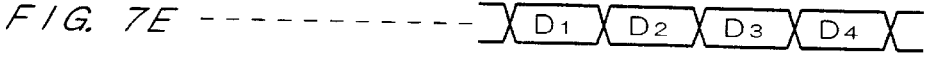
FIG. 7E
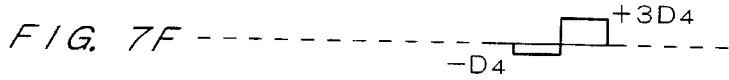
FIG. 7F
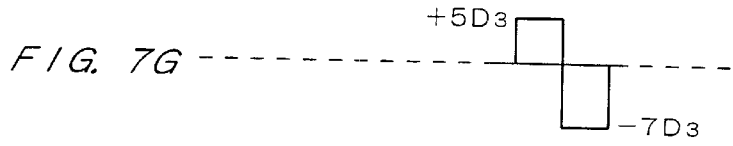
FIG. 7G
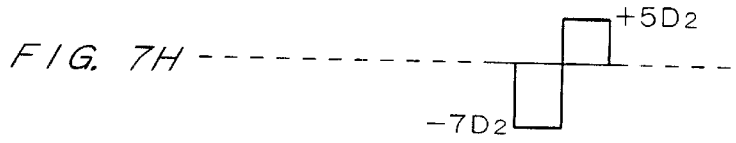
FIG. 7H
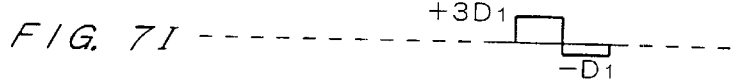
FIG. 7I
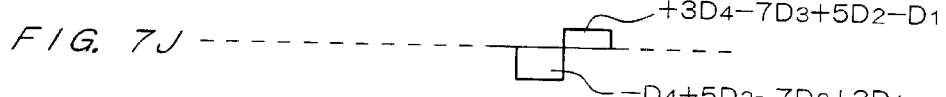
FIG. 7J
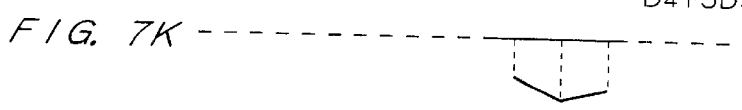
FIG. 7K
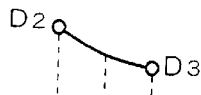
FIG. 7L F I G. 10
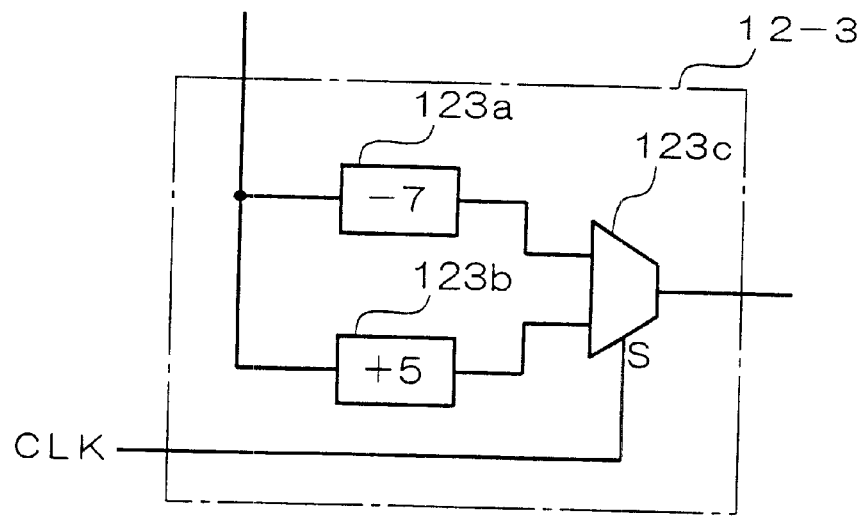
F I G. 11
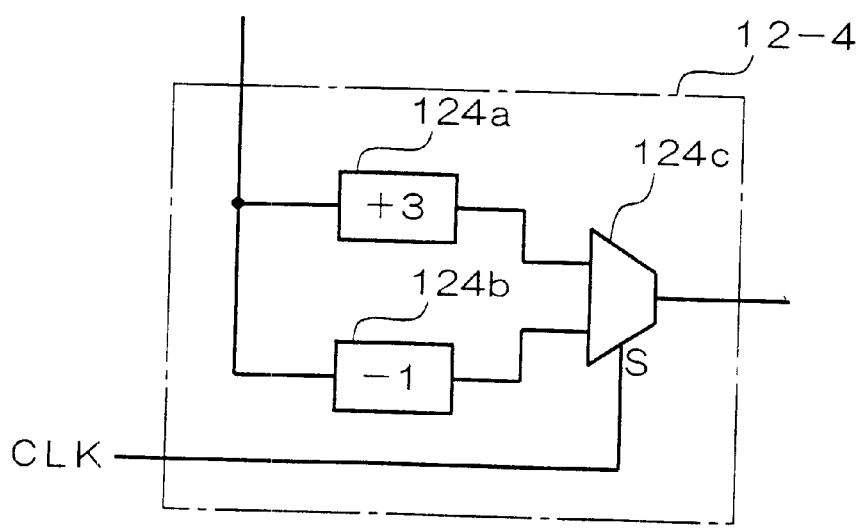

DIGITAL-TO-ANALOG CONVERTER USING DIFFERENT MULTIPLICATORS BETWEEN FIRST AND SECOND PORTIONS OF A DATA HOLDING PERIOD

TECHNICAL FIELD

The present invention relates to a digital-to-analog converter for converting discrete digital data into continuous analog signals. In this specification, it is assumed that a case where function values have finite values except zero in a local region and become zero in regions different from the region is called a "local support."

BACKGROUND ART

A recent digital audio apparatus, for example, a CD (Compact Disk) player, uses a D/A (digital-to-analog) converter to which an over-sampling technique is applied to obtain a continuous analog audio signal from discrete music data (digital data). Such a D/A converter generally uses a digital filter to raise a pseudo sampling frequency by interpolating input digital data, and outputs smooth analog audio signals by passing each interpolation value through a low-pass filter after generating a staircase signal waveform with each interpolation value held by the sample holding circuit.

A data interpolation system disclosed in WO99/38090 is well known as a method of interpolating data into discrete digital data. In this data interpolation system, differentiation can be performed only once in the whole range, and a sampling function is used such that two sampling points each before and after an interpolation position, that is, a total of four sampling points, can be considered. Since the sampling function has values of a local support unlike the sinc function defined by $\sin(\pi ft)/(\pi ft)$ where f indicates a sampling frequency, there is a merit that no truncation errors occur although only four pieces of digital data are used in the interpolating operation.

Generally, oversampling is performed by using a digital filter in which the waveform data of the above mentioned sampling function is set to a tap coefficient of an FIR (finite impulse response) filter.

If the oversampling technology of performing an interpolating operation for discrete digital datausing the above mentioned digital filter, a low pass filter having a moderate attenuation characteristic can be used. Therefore, the phase characteristic with a low pass filter can approach a linear phase characteristic, and the sampling aliasing noise can be reduced. These effects are more outstanding with a higher oversampling frequency. However, if the sampling frequency becomes higher, the performance of the digital filter and the sample hold circuit is also sped up. Therefore, it is necessary to use expensive parts appropriate for the quick performance, thereby increasing the cost of the required parts. In addition, when the sampling frequency is high (for example, several MHz) as in the case of image data, it is necessary to configure a digital filter or a sample hold circuit using parts operable at several tens MHz to several hundreds MHz, which cannot be easily realized.

Additionally, although the oversampling technology is used, a smooth analog signal is generated by passing a signal waveform in the form of steps through a low pass filter. Therefore, a desired linear phase characteristic cannot be realized so far as a low pass filter is used, and an output waveform is distorted.

BRIEF SUMMARY OF THE INVENTION

The present invention has been achieved to solve the above mentioned problems, and aims at providing a digital-to-analog converter capable of obtaining an output waveform having less distortion without speeding up the operations of the parts.

In the digital-to-analog converter according to the present invention, a plurality of data holding unit hold plural pieces of digital data input at predetermined intervals, and a plurality of multiplying unit perform multiplying processes using respective multiplicators for the first half and the second half of the data holding period on the digital data held in the respective data holding unit. After stepwise voltage waveform generation unit have generated a stepwise analog voltage corresponding to the digital data obtained by adding unit adding up multiplication results, a plurality of integrating unit perform analog integration several times, and continuous analog signals smoothly connecting voltage values corresponding to sequentially input respective digital data are generated. Thus, the multiplication results corresponding to sequentially input plural pieces of digital data are added up, and then the addition result is converted into an analog voltage and integrated, thereby obtaining continuously changing analog signals. As a result, it is not necessary to use a low pass filter to obtain a final analog signal, a group delay characteristic is not deteriorated by different phase characteristics depending on the applicable signal frequencies, and therefore an output waveform can be obtained with less distortion. As compared with the conventional method used with oversampling, the cost of parts can be reduced because it is not necessary to speed up the operations of the parts and to use expensive parts.

Each of the multiplicators used in the multiplying processes by the plurality of multiplying unit is desired to correspond to each of the values of step functions obtained by differentiating plural times piecewise polynomials for a predetermined sampling function configured by the piecewise polynomials. That is, by integrating plural times the above mentioned step function, a waveform corresponding to the predetermined sampling function can be obtained. Therefore, a convolution operation using a sampling function can be equivalently realized by generating a step function. As a result, the contents of the entire process can be simplified, and the number of processes required converting digital data into analog signals can be successfully reduced.

In addition, the above mentioned step function is desired to equally set the positive and negative regions. Thus, the divergence of integration results of the integrating unit can be prevented.

Furthermore, it is desirable that the above mentioned sampling function has a value of local support with the whole range differentiable only once. It is assumed that a natural phenomenon can be approximated if the whole range is differentiable only once. By setting a smaller number of times of differentiation, the times of the analog integration performed by the integrating unit can be reduced, thereby successfully simplifying the configuration.

It is further desirable that the above mentioned step function contains an area of eight piecewise sections in equal width weighted by −1, +3, +5, −7, −7, +5, +3, and −1 in a predetermined range corresponding to five pieces of digital data arranged at equal intervals, and that every two of the eight weight coefficients are set as the multiplicators in the respective multiplying unit. Since simple weight coefficients represented by integers can be used as the multiplicators in each of the respective multiplying unit, the multiplying process can be simplified.

Especially, it is desirable that a multiplying process performed in each of the plurality of multiplying unit is represented by adding digital data to an operation result of the exponentiation of 2 by a bit shift. Since the multiplying process can be replaced with a bit shift process and an adding operation, the configuration can be simplified and the process can be sped up by simplifying the contents of the processes.

It is also desirable that the times of the analog integration is two, and an analog signal whose voltage level changes like a quadric function is output from the integrating unit. By interpolating an analog signal which changes like a quadric function into a voltage value corresponding to discrete digital data, a desired output waveform can be obtained without unnecessary high frequency components, etc.

BRIEF DESCRIPTION OF THE DRAWINGS

FIG. 1 is a diagram showing a sampling function used in an interpolating operation in the D/A converter according to an embodiment;

FIG. 2 is a diagram showing a relationship between the sampling values with an interpolation values;

FIGS. 7A through 7L are charts showing the operation timings of the D/A converter of an embodiment;

FIG. 10 is a diagram showing a detailed configuration of the multiplier;

FIG. 11 is a diagram showing a detailed configuration of the multiplier;

BEST MODE FOR CARRYING OUT THE INVENTION

An embodiment of the D/A converter according to the present invention is described below in detail by referring to the attached drawings. FIG. 1 shows a sampling function used in an interpolating operation in the D/A converter according to the present embodiment. The sampling function H(t) is disclosed by WO99/38090, and represented by the following expressions.

| $(-t^2-4t-4)/4$ | ;$-2 \leq t < -3/2$ | (1) |
| $(3t^2+8t+5)/4$ | ;$-3/2 \leq t < -1$ | |
| $(5t^2+12t+7)/4$ | ;$-1 \leq t < -1/2$ | |
| $(-7t^2+4)/4$ | ;$-1/2 \leq t < 0$ | |
| $(-7t^2+4)/4$ | ;$0 \leq t < 1/2$ | |
| $(5t^2-12t+7)/4$ | ;$1/2 \leq t < 1$ | |
| $(3t^2-8t+5)/4$ | ;$1 \leq t < 3/2$ | |
| $(-t^2+4t-4)/4$ | ;$3/2 \leq t \leq 2$ | | where $t=0, \pm 1, \pm 2$ indicates the sampling position. The sampling function H(t) shown in FIG. 1 can be differentiated only once in the whole range, and is a function of a local support converging into 0 with the sampling position $t=\pm 2$. By performing an overlapping process using the sampling function H(t) based on each sampling value, the interpolating process can be performed using a function differentiable only once in the sampling values.

FIG. 2 shows the relationship between the sampling values and the interpolation values. As shown in FIG. 2, assume that four sampling positions are t1, t2, t3, and t4, and the distance between two adjacent sampling positions is 1. The interpolation value y corresponding to the interpolation position t0 between the sampling positions t2 and t3 is obtained by the following equation.

$$y = Y(t1) \cdot H(1+a) + Y(t2) \cdot H(a) + Y(t3) \cdot H(1-a) + Y(t4) \cdot H(2-a) \quad (2)$$

where Y(t) indicates each sampling value at the sampling position t. Each of 1+a, a, 1−a, and 2−a indicates the distance between the interpolation position t0 and each of the sampling positions t1 through t4.

As described above, by performing a convolution operation by computing the value of the sampling function H(t) corresponding to each sampling value, an interpolation value of sampling values can be obtained theoretically. However, the sampling function shown in FIG. 1 is a quadric piecewise polynomial differentiable only once in the whole range. Using this feature, the interpolation value can be obtained in another equivalent process procedure.

Figure 3:
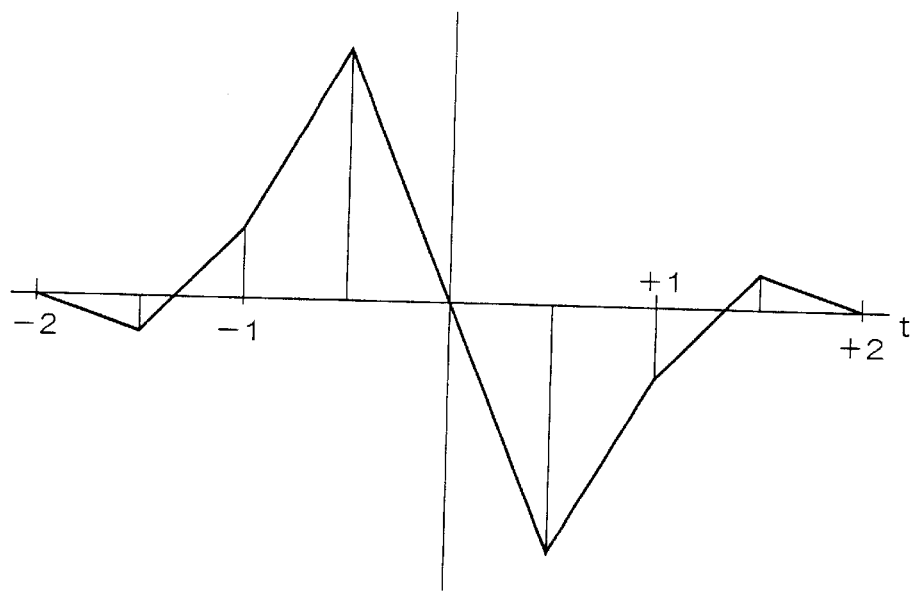
FIG. 3 is a diagram showing a waveform obtained by differentiating once the sampling function shown in FIG. 1.

FIG. 3 shows a waveform obtained by differentiating once the sampling function shown in FIG. 1. The sampling function H(t) shown in FIG. 1 is a quadric piecewise polynomial differentiable once in the entire range. Therefore, by performing the differentiation once, a polygonal line function formed by the waveform of a continuous polygonal line as shown in FIG. 3 can be obtained.

Figure 4:
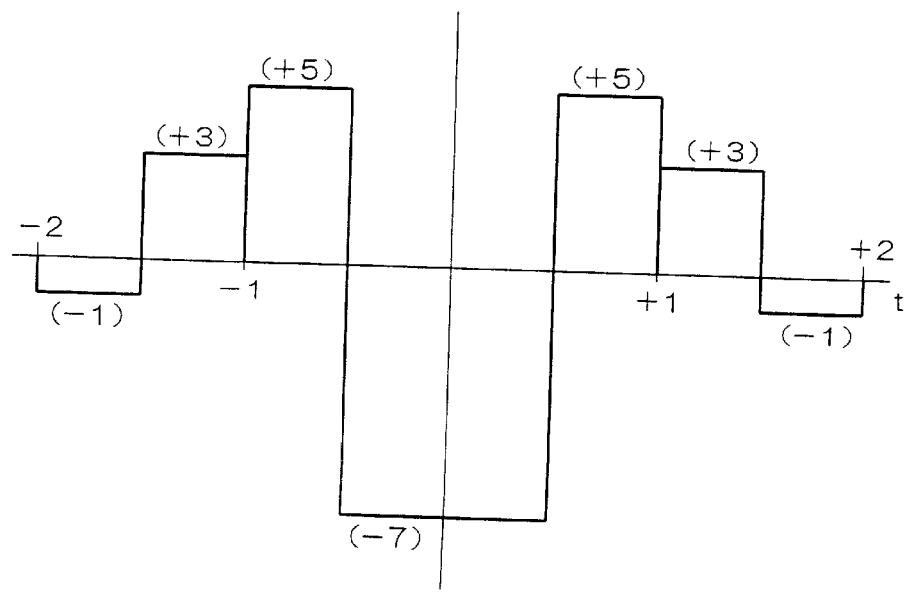
FIG. 4 is a diagram showing a the waveform obtained by further differentiating the polygonal line function shown in FIG. 3.

FIG. 4 shows the waveform obtained by further differentiating the polygonal line function shown in FIG. 3. However, the polygonal line waveform contains a plurality of corner points, and the differentiation cannot be performed in the whole range. Therefore, the differentiation is performed on the linear portion between two adjacent corner points. By differentiating the polygonal line waveform shown in FIG. 3, the step function formed by the stepwise waveform as shown in FIG. 4 can be obtained.

Thus, the above mentioned sampling function H(t) is once differentiated in the entire range to obtain a polygonal line function. By further differentiating each of the linear portions of the polygonal line function, a step function can be obtained. Therefore, in the reverse order, by generating the step function shown in FIG. 4, and integrating it twice, the sampling function H(t) shown in FIG. 1 can be obtained.

In the step function shown in FIG. 4, the positive and negative regions are set equal to each other, and the sum of the regions equals 0. That is, by integrating such a step function plural times, a sampling function of local support, as shown in FIG. 1, whose differentiability in the whole range is guaranteed can be obtained. In computing the interpolation value in the convolution operation shown by the equation (2), the value of the sampling function H(t) is multiplied by each sampling value. If the sampling function H(t) is obtained by integrating twice the step function shown in FIG. 4, the value of the sampling function obtained in the integrating process is multiplied by each sampling value, or equivalently, when a step function before the integration processing is generated, an interpolation value can be obtained by generating a step function by multiplication by each sampling value, and performing twice the integrating process on the result obtained in the convolution operation using the step function. The D/A converter according to the present embodiment obtains an interpolation value as described above. This process is described below in detail.

Figure 5:
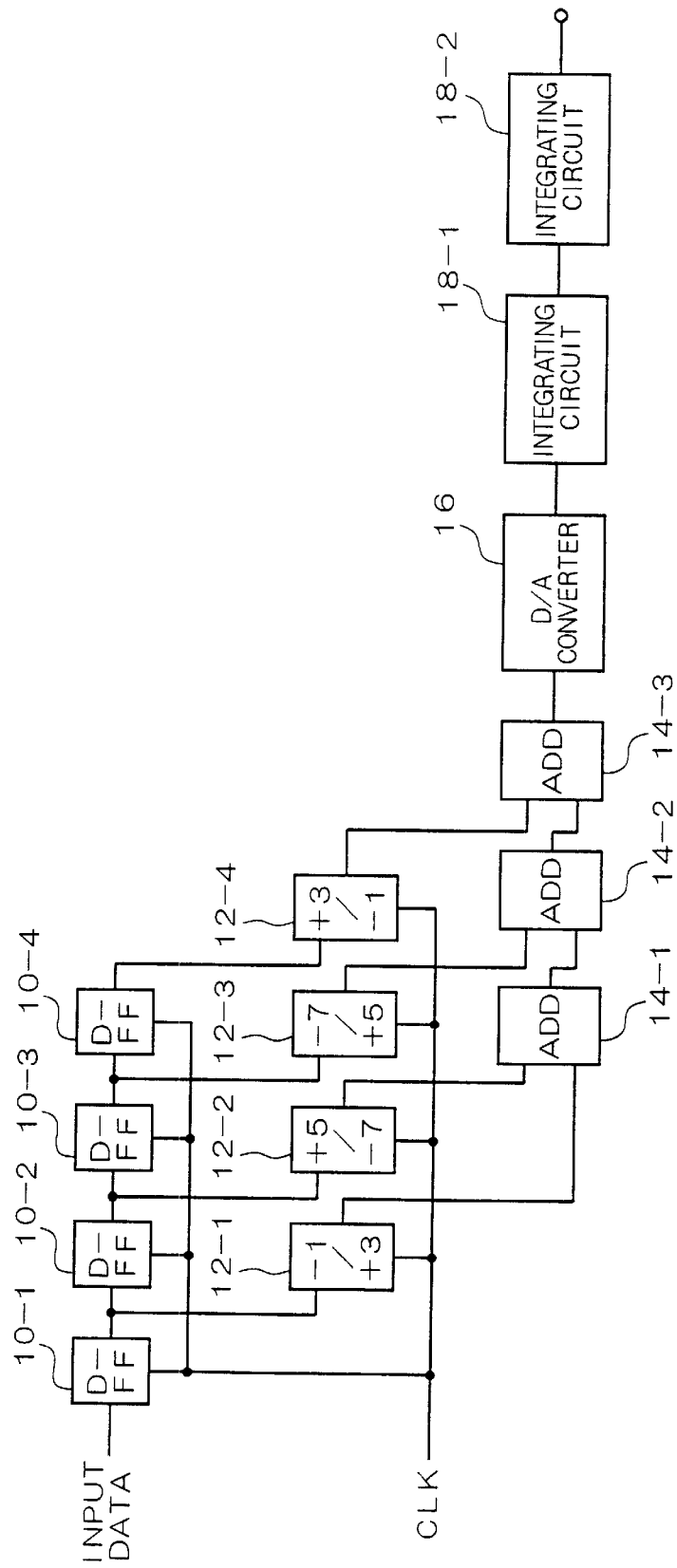
FIG. 5 is a diagram showing a the configuration of a D/A converter of an embodiment.

FIG. 5 shows the configuration of the D/A converter according to the present embodiment. The D/A converter shown in FIG. 5 is configured by four D flip-flops (D-FF) 10-1, 10-2, 10-3, and 10-4, four multipliers 12-1, 12-2, 12-3, and 12-4, three adders (ADD) 14-1, 14-2, and 14-3, aD/A converter 16, and two integrating circuits 18-1 and 18-2.

The four serially connected D flip-flops 10-1 through 10-4 hold data synchronous with a clock signal CLK, sequentially fetch the digital data input to the first D flip-flop 10-1, and hold the value. For example, assuming that data $D_1, D_2, D_3, D_4, \ldots$ are sequentially input into the first D flip-flop 10-1, the third, second, and first input data $D_3, D_2,$ and $D_1$ are respectively held in the second, third, and fourth D flip-flops 10-2, 10-3, and 10-4 at the timing of holding the fourth input data $D_4$ in the first D flip-flop 10-1.

Each of the four multipliers 12-1 through 12-4 has two types of multiplicators, and performs different multiplying processes between the first half and the second half of each period of the clock signal CLK. For example, the multiplier 12-1 performs the multiplying process using a multiplicator of −1 in the first half of each period of the clock signal CLK, and performs the multiplying process using a multiplicator of +3 in the second half. The multiplier 12-2 performs the multiplying process using a multiplicator of +5 in the first half of each period of the clock signal CLK, and performs the multiplying process using a multiplicator of −7 in the second half. The multiplier 12-3 performs the multiplying process using a multiplicator of −7 in the first half of each period of the clock signal CLK, and performs the multiplying process using a multiplicator of +5 in the second half. The multiplier 12-4 performs the multiplying process using a multiplicator of +3 in the first half of each period of the clock signal CLK, and performs the multiplying process using a multiplicator of −1 in the second half.

Each value of the step function shown in FIG. 4 can be obtained by differentiating twice each piecewise polynomial in the above mentioned expressions (1) as follows.

$-1 \; ; -2 \leq t < -3/2$
$+3 \; ; -3/2 \leq t < -1$
$+5 \; ; -1 \leq t < -1/2$
$-7 \; ; -1/2 \leq t < 0$
$-7 \; ; 0 \leq t < 1/2$
$+5 \; ; 1/2 \leq t < 1$
$+3 \; ; 1 \leq t < 3/2$
$-1 \; ; 3/2 \leq t \leq 2$ Regarding the portion where the sampling position t ranges from −2 to −1, the values of the step function are −1 in the first half, and +3 in the second half. These values correspond to the multiplicators of the multiplier 12-1. Similarly, regarding the portion where the sampling position t ranges from −1 to 0, the values of the step function are +5 in the first half, and −7 in the second half. These values correspond to the multiplicators of the multiplier 12-2. Regarding the portion where the sampling position t ranges from 0 to +1, the values of the step function are −7 in the first half, and +5 in the second half. These values correspond to the multiplicators of the multiplier 12-3. Regarding the portion where the sampling position t ranges from +1 to +2, the values of the step function are +3 in the first half, and −1 in the second half. These values correspond to the multiplicators of the multiplier 12-4.

Each of the three adders 14-1 through 14-3 is used to add up the multiplication results of the above mentioned four multipliers 12-1 through 12-4. The adder 14-1 adds up the multiplication results of the two multipliers 12-1 and 12-2. The adder 14-2 adds up the multiplication result of the multiplier 12-3 and the addition result of the adder 14-1. Furthermore, the adder 14-3 adds up the multiplication result of the multiplier 12-4 and the addition result of the adder 14-2. Using these three adders 14-1 through 14-3, the multiplication results of the four multipliers 12-1 through 12-4 are added up. Since multiplying processes are performed using different multiplicators between the first half and the second half of each period of the clock signal CLK in each of the multipliers 12-1 through 12-4 as described above, the output value of the adder 14-3 obtained by adding up the multiplication results also refers to the digital data in the form of steps having different values between the first half and the second half of each period of the clock signal CLK.

According to the present embodiment, four multiplication results of the four multipliers 12-1 through 12-4 are added up by the three adders 14-1 through 14-3, but the number of adders can be reduced by using an adder having three or more input terminals.

The D/A converter 16 generates an analog voltage corresponding to the stepwise digital data output by the adder 14-3. Since the D/A converter 16 generates a constant analog voltage proportional to the value of the input digital data, an output voltage in the form of steps having different voltage values between the first half and the second half of each period of the clock signal CLK can be obtained.

The two serially connected integrating circuits 18-1 and 18-2 perform two integrating processes on the output voltage in the form of steps appearing at the output terminal of the D/A converter 16. A linearly changing output voltage (like a linear function) is obtained from the integrating circuit 18-1 at the first stage, and an output voltage changing like a quadric function is obtained from the integrating circuit 18-2 at the subsequent stage. Thus, when plural pieces of digital data are input at predetermined intervals to the first D flip-flop 10-1, continuous analog signals connected through a smooth curve differentiable only once in the voltage values corresponding to respective pieces of digital data are obtained from the integrating circuit 18-2 at the subsequent stage.

Figure 6:
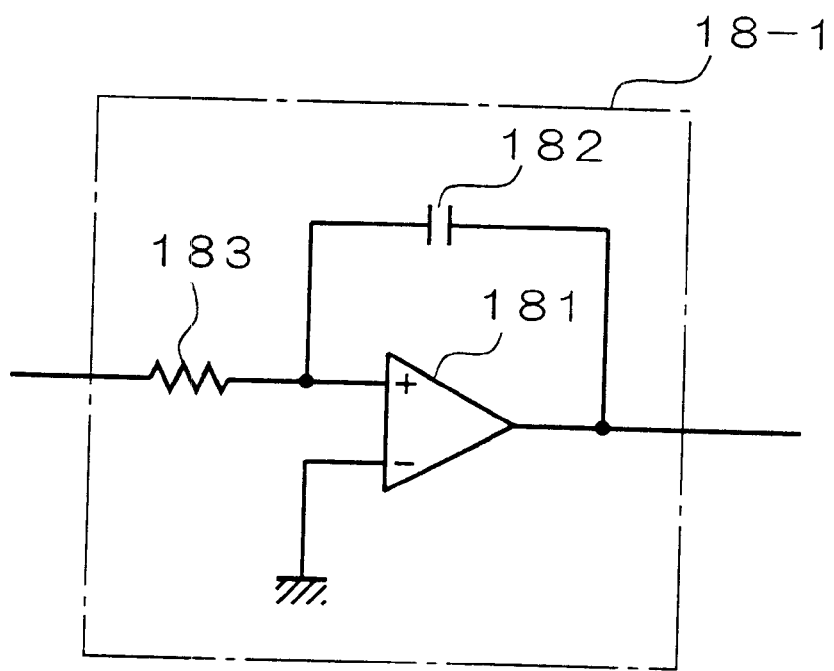
FIG. 6 is a block diagram showing an example of a practical configuration of an integrating circuit.

FIG. 6 shows an example of a practical configuration of an integrating circuit. In FIG. 6, an example of a practical configuration of the integrating circuit 18-1, but the integrating circuit 18-2 can also be realized with the similar configuration. The integrating circuit 18-1 shown in FIG. 6 is a common analog integrating circuit comprising an operational amplifier 181, a capacitor 182, and a resistance 183. A predetermined integrating operation is performed on the voltage applied to one terminal of the resistance 183.

The above mentioned D flip-flops 10-1 through 10-4 correspond to a plurality of data holding unit, the multipliers 12-1 through 12-4 correspond to a plurality of multiplying unit, the adders 14-1 through 14-3 correspond to adding unit, the D/A converter 16 corresponds to a stepwise voltage waveform generation unit, and the integrating circuits 18-1 and 18-2 correspond to integrating unit.

FIGS. 7A through 7L show operation timings of the D/A converter according to the present embodiment. In synchronization with the rise of each period of the clock signal CLK shown in FIG. 7A, the data $D_1$, $D_2$, $D_3$, $D_4$, . . . are sequentially input into the first D flip-flop 10-1. FIGS. 7B to 7E show the contents of the data held in the D flip-flops 10-1 through 10-4 respectively. In the explanation below, for example, the timing of one clock of holding the fourth input data $D_4$ in the first D flip-flop 10-1 is considered.

At the timing of holding the fourth input data $D_4$ in the first D flip-flop 10-1, the third input data $D_3$ is held in the second D flip-flop 10-2, the second input data $D_2$ is held in the third D flip-flop 10-3, and the first input data $D_1$ is held in the fourth D flip-flop 10-4.

The multiplier 12-1 receives the data $D_4$ held in the first D flip-flop 10-1, outputs in the first half of one clock period the multiplication result of $-D_4$ obtained by multiplying the input data $D_4$ by $-1$, and outputs in the second half the multiplication result of $+3D_4$ obtained by multiplying the input data $D_4$ by $+3$ (FIG. 7F). Similarly, the multiplier 12-2 receives the data $D_3$ held in the second D flip-flop 10-2, outputs in the first half of one clock period the multiplication result of $+5D_3$ obtained by multiplying the input data $D_3$ by $+5$, and outputs in the second half the multiplication result of $-7D_3$ obtained by multiplying the input data $D_3$ by $-7$ (FIG. 7G). The multiplier 12-3 receives the data $D_2$ held in the third D flip-flop 10-3, outputs in the first half of one clock period the multiplication result of $-7D_2$ obtained by multiplying the input data $D_2$ by $-7$, and outputs in the second half the multiplication result of $+5D_2$ obtained by multiplying the input data $D_2$ by $+5$ (FIG. 7H). The multiplier 12-4 receives the data $D_1$ held in the fourth D flip-flop 10-4, outputs in the first half of one clock period the multiplication result of $+3D_1$ obtained by multiplying the input data $D_1$ by $+3$, and outputs in the second half the multiplication result of $-D_1$ obtained by multiplying the input data $D_1$ by $-1$ (FIG. 7I).

The three adders 14-1 through 14-3 add up the four multiplication results obtained by the four multipliers 12-1 through 12-4. Therefore, in the first half of one clock period, the adder 14-3 outputs the addition result $(-D_4+5D_3-7D_2+3D_1)$ obtained by adding up the multiplication results obtained in the first half of one clock period by the four multipliers 12-1 through 12-4. In the second half of one clock period, the adder 14-3 outputs the addition result $(3D_4-7D_3+5D_2-D_1)$ obtained by adding up the multiplication results obtained in the second half of one clock period by the four multipliers 12-1 through 12-4.

Thus, when the adder 14-3 sequentially outputs a step-shaped addition result, the D/A converter 16 generates an analog voltage based on the addition result (digital data). Since the D/A converter 16 generates a constant analog voltage proportional to the value of the input digital data, an output waveform formed by a changing voltage level stepwise corresponding the input digital data can be obtained (FIG. 7J).

When the D/A converter 16 outputs a waveform having a stepwise voltage level, the integrating circuit 18-1 at the preceding stage outputs a polygonal line waveform by integrating the waveform (FIG. 7K), the integrating circuit 18-2 at the subsequent stage further integrates the polygonal line waveform, and generates an output voltage connected through a smooth curve differentiable only once in the voltage values corresponding to the digital data $D_2$ and $D_3$ (FIG. 7L).

Thus, the D/A converter according to the present embodiment sequentially holds the input digital data in the four serially connected D flip-flops 10-1 through 10-4, respectively corresponding to which four multipliers 12-1 through 12-4 perform different multiplying processes between the first half and the second half of one clock period as data holding period. Then, the adders 14-1 through 14-3 add the multiplication results. The D/A converter 16 generates an analog voltage corresponding to the addition result, and then the two integrating circuits 18-1 and 18-2 perform two integrating processes, thereby generating continuous analog signals smoothly connecting the voltage values corresponding to the input digital data.

The continuous analog signals can be obtained by obtaining two multiplication results having different values between the first half and the second half of one clock period corresponding to the four pieces of input digital data, adding them up, generating an analog voltage corresponding to the addition result, and performing two integrating processes. Therefore, the conventional sample hold circuit or low pass filter is not required, thereby preventing deterioration in a linear phase characteristic, reducing the distortion of an output waveform, and realizing a desired group delay characteristic.

Furthermore, since the conventional oversampling process is not performed, it is necessary only to guarantee a predetermined operation speed depending on the time intervals of input digital data, and since it is unnecessary to perform any high speed signal processing, no expensive parts are required. For example, the conventional D/A converter performs the oversampling process to obtain 1024 pseudo-frequencies as sampling frequencies, thereby requiring the operation speeds of respective parts depending on the pseudo frequencies. On the other hand, it is necessary for the D/A converter according to the present embodiment only to operate each multiplier or each adder at a frequency two times as high as the sampling frequency, and consequently it is possible to reduce the operation speeds of the respective parts to a large extent.

Described below is an example of a detailed configuration of each part of the D/A converter according to the present embodiment. FIGS. 8 through 11 show the configurations of the four multipliers 12-1 through 12-4.

Figure 8:
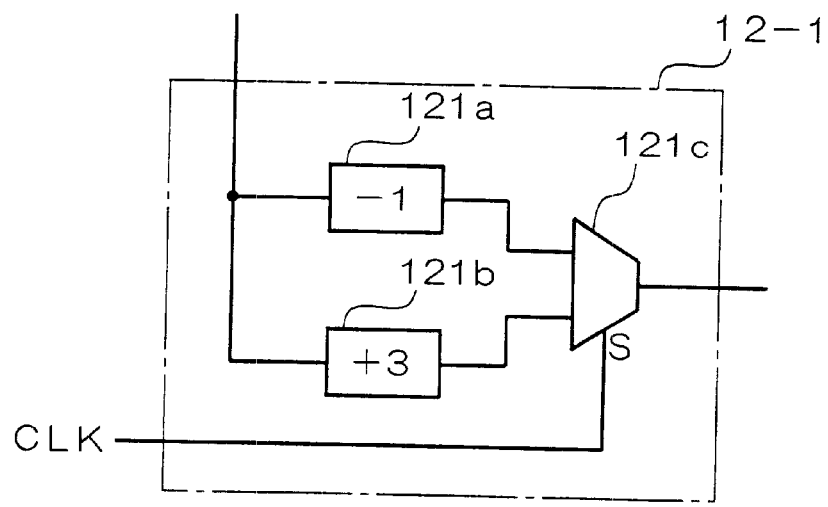
FIG. 8 is a diagram showing a detailed configuration of the multiplier.

As shown in FIG. 8, the multiplier 12-1 comprises two multipliers 121a and 121b in which values of multiplicator are fixed, and a selector 121c. One multiplier 121a performs a multiplying process using a multiplicator of $-1$, and the other multiplier 121b performs a multiplying process using a multiplicator of $+3$. The selector 121c receives the multiplication results of the two multipliers 121a and 121b, outputs a multiplication result obtained from one multiplier 121a using a multiplicator of $-1$ when the clock signal CLK input to the control terminal S indicates a high level, that is, in the first half of one clock period, and outputs a multiplication result obtained from the other multiplier 121b using a multiplicator of $+3$ when the clock signal CLK input to the control terminal S indicates a low level, that is, in the second half of one clock period.

Figure 9:
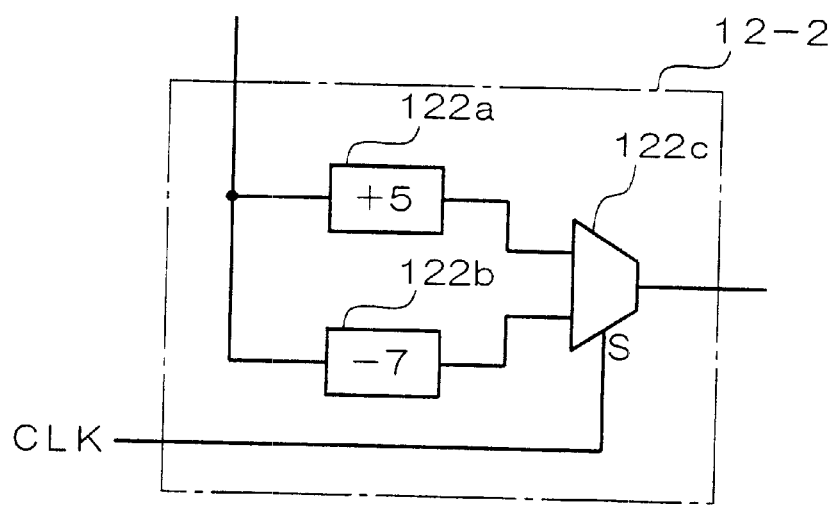
FIG. 9 is a diagram showing a detailed configuration of the multiplier.

Similarly, the multiplier 12-2 comprises two multipliers 122a and 122b in which values of multiplicator are fixed, and a selector 122c as shown in FIG. 9. One multiplier 122a performs a multiplying process using a multiplicator of $+5$, and the other multiplier 122b performs a multiplying process using a multiplicator of $-7$. The selector 122c receives the multiplication results of the two multipliers 122a and 122b, outputs a multiplication result obtained from one multiplier 122a using a multiplicator of $+5$ when the clock signal CLK input to the control terminal S indicates a high level (in the first half of one clock period), and outputs a multiplication result obtained from the other multiplier 122b using a multiplicator of −7 when the clock signal CLK input to the control terminal S indicates a low level (in the second half of one clock period).

As shown in FIG. 10, the multiplier 12-3 comprises two multipliers 123a and 123b in which multiplicator values are fixed, and a selector 123c. One multiplier 123a performs a multiplying process using a multiplicator of −7, and the other multiplier 123b performs a multiplying process using a multiplicator of +5. The selector 123c receives the multiplication results of the two multipliers 123a and 123b, outputs a multiplication result obtained from one multiplier 123a using a multiplicator of −7 when the clock signal CLK input to the control terminal S indicates a high level (in the first half of one clock period), and outputs a multiplication result obtained from the other multiplier 123b using a multiplicator of +5 when the clock signal CLK input to the control terminal S indicates a low level (in the second half of one clock period).

As shown in FIG. 11, the multiplier 12-4 comprises two multipliers 124a and 124b in which values of multiplicator are fixed, and a selector 124c. One multiplier 124a performs a multiplying process using a multiplicator of +3, and the other multiplier 124b performs a multiplying process using a multiplicator of −1. The selector 124c receives the multiplication results of the two multipliers 124a and 124b, outputs a multiplication result obtained from one multiplier 124a using a multiplicator of +3 when the clock signal CLK input to the control terminal S indicates a high level (in the first half of one clock period), and outputs a multiplication result obtained from the other multiplier 124b using a multiplicator of −1 when the clock signal CLK input to the control terminal S indicates a low level (in the second half of one clock period).

Thus, each multiplier performs a multiplying process using different multiplicators between the first half and the second half of one clock period.

The above mentioned four multipliers 12-1 through 12-4 use four multiplicator values of −1, +3, +5, and −7. When 1 is subtracted from each multiplier, they are −2, +2, +4, and −8, that is, the values of the power of 2. As a result, the multiplying processes using these values as multiplicators can be realized by a simple bit shift. Regarding these specific values as multiplicators of each multiplier according to the present embodiment, the configuration of each multiplier can be simplified.

FIGS. 12 through 15 show the configurations of the four simplified multipliers 12-1 through 12-4.

Figure 12:
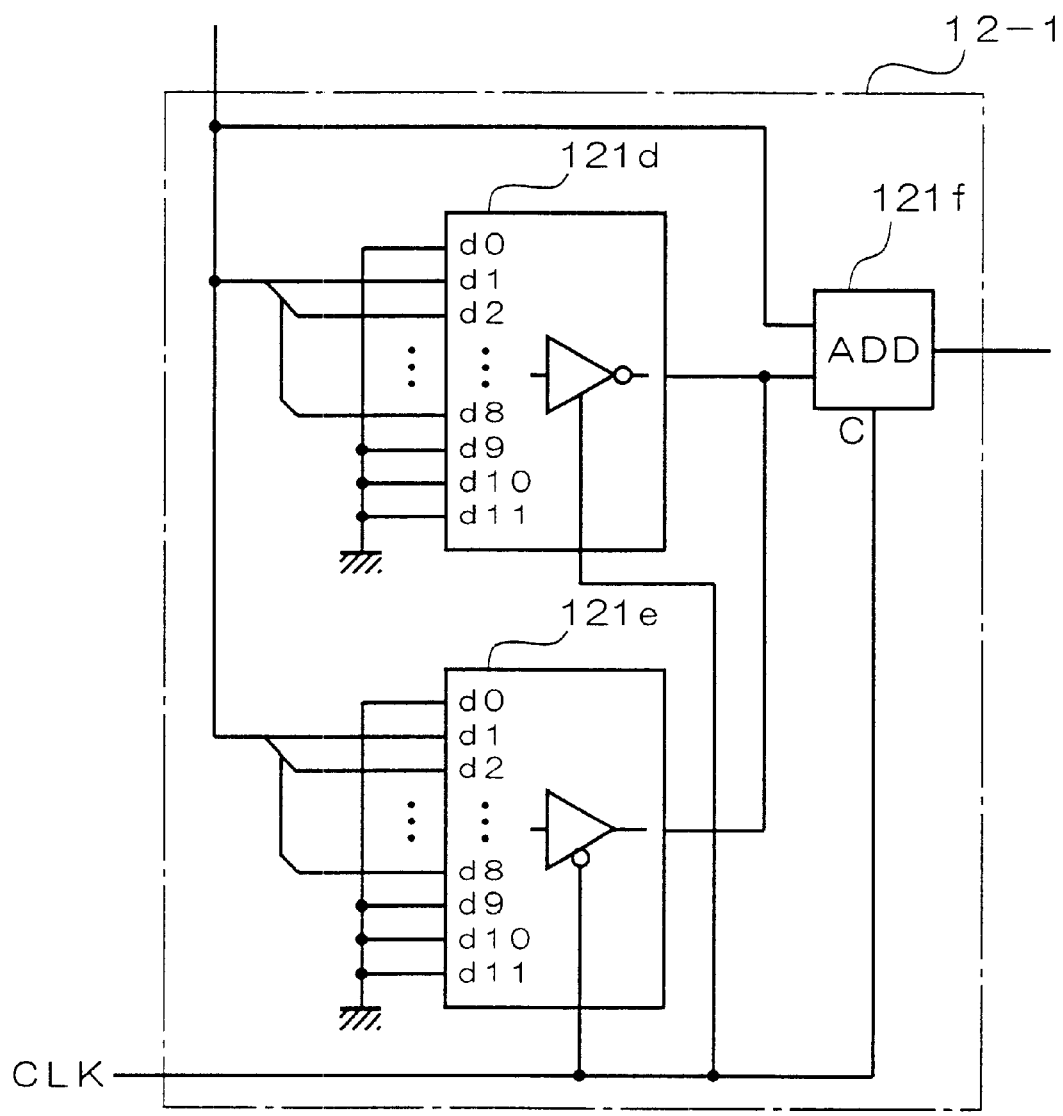
FIG. 12 is a diagram showing a detailed configuration of the multiplier.

The multiplier 12-1 comprises a tri-state buffer 121d having an inverting output terminal, a tri-state buffer 121e having a non-inverting output terminal, and an adder (ADD) 121f having two input terminals and carry terminal C as shown in FIG. 12.

When the clock signal CLK input to the control terminal indicates a high level (in the first half of one clock period), the tri-state buffer 121d shifts the input data to a higher bit by one bit, and inverts and outputs each bit of the shifted data, thereby performing a multiplying process by a multiplicator of −2. Actually, by obtaining a complement by adding 1 after inverting each bit, a multiplying process can be performed using a multiplicator of −2. The process of adding 1 is performed by the adder 121f at the subsequent stage.

Furthermore, when the clock signal inverted and input to the control terminal indicates a low level (in the second half of one clock period), the tri-state buffer 121e shifts the input data to a higher bit by one bit, and outputs the data, thereby performing a multiplying process by a multiplicator of 2.

The adder 121f adds the input data (the data output from the D flip-flop 10-1) before the multiplication to the multiplication result output from any of the two tri-state buffers 121d and 121e, and further adds 1 corresponding to the carry when the clock signal CLK input to the carry terminal C indicates a high level (in the first half of one clock period) As described above, the addition of 1 corresponding to the carry is performed to obtain a complement using the tri-state buffer 121d.

Since the operation of only the tri-state buffer 121d is valid in the first half of one clock period in the multiplier 12-1 with the above mentioned configuration, the adder 121f outputs a sum (−2D +D=−D) obtained by adding the input data D to the multiplication result (−2D) obtained by multiplying the input data D by −2. In the second half of one clock period, since the operation of only the other tri-state buffer 121e is valid, the adder 121f outputs a sum (+2D+D=+3D) obtained by adding the input data D to the multiplication result (+2D) obtained by multiplying the input data D by +2.

Thus, by performing multiplying processes using multiplicators of −1 and +3 by combining the multiplying process of the exponentiation of 2 by a bit shift with the adding process, the multiplier 12-1 can be configured only by tri-state buffers and an adder, thereby simplifying the configuration. Especially, since the output of the two tri-state buffers is selectively used, the out put terminals can be wired OR-connected, thereby furthermore simplifying the configuration.

Figure 13:
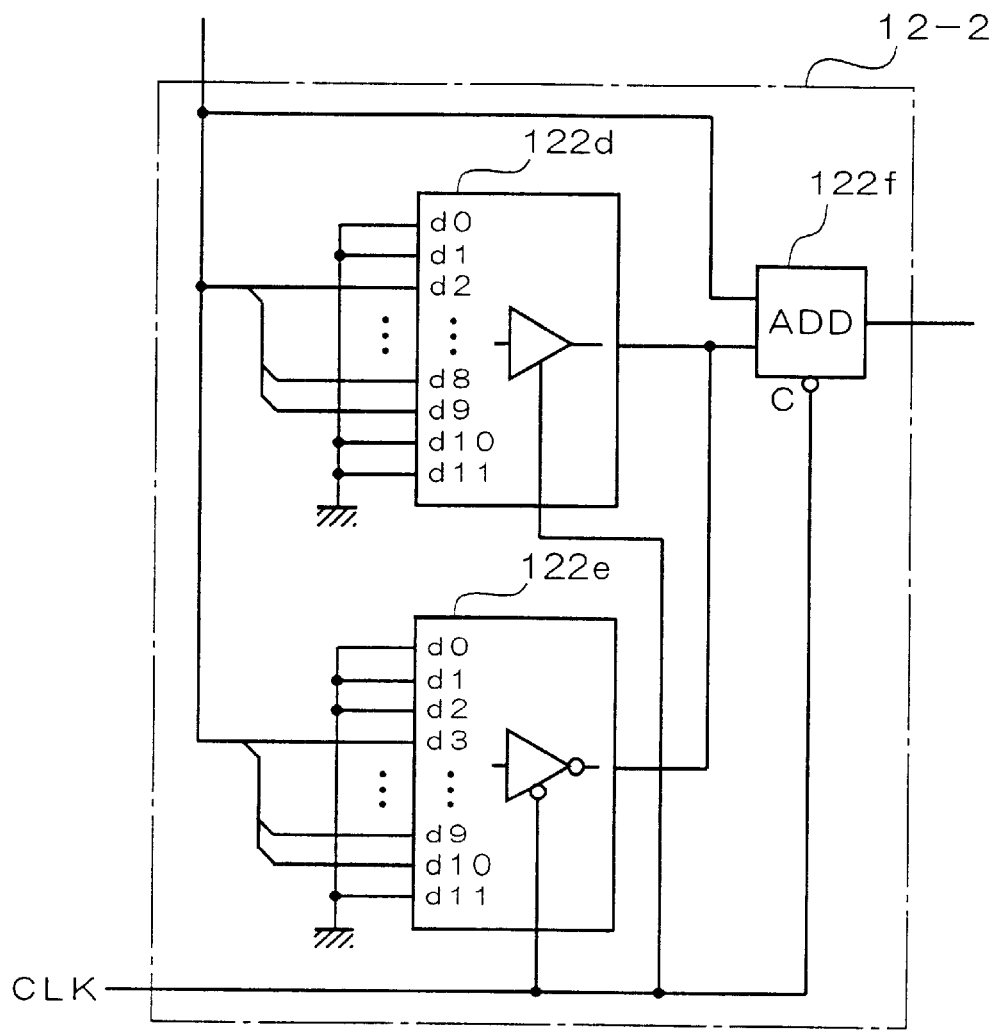
FIG. 13 is a diagram showing a detailed configuration of the multiplier.

In addition, the multiplier 12-2 comprises a tri-state buffer 122d having a non-inverting output terminal, a tri-state buffer 122e having an inverting output terminal, and an adder (ADD) 122f having two input terminals and a carry terminal C as shown in FIG. 13.

When the clock signal input to the control terminal indicates a high level (in the first half of one clock period), the tri-state buffer 122d shifts the input data to a higher bit by two bits, and outputs the shifted data, thereby performing a multiplying process by a multiplicator of +4.

When the clock signal CLK inverted and input to the control terminal indicates a low level (in the second half of one clock period), the tri-state buffer 122e shifts and outputs the input data to a higher bit by three bits, and outputs the data after inverting each bit of the shifted data, thereby performing a multiplying process by a multiplicator of −8. Actually, by obtaining a complement by adding 1 after inverting each bit, a multiplying process can be performed using a multiplicator of −8. The process of adding 1 is performed by the adder 122f at the subsequent stage.

The adder 122f adds the input data before the multiplication to the multiplication result output from any of the two tri-state buffers 122d and 122e, and further adds 1 corresponding to the carry when the clock signal CLK inverted and input to the carry terminal C indicates a low level (in the second half of one clock period). As described above, the addition of 1 corresponding to the carry is performed to obtain a complement using the tri-state buffer 122e.

Since the operation of only the tri-state buffer 122d is valid in the first half of one clock period in the multiplier 12-2 with the above mentioned configuration, the adder 122f outputs a sum (+4D+D=+5D) obtained by adding the input data D to the multiplication result (+4D) obtained by multiplying the input data D by +4. In the second half of one clock period, since the operation of only the other tri-state buffer 122e is valid, the adder 122f outputs a sum (−8D+D=−7D) obtained by adding the input data D to the multiplication result (−8D) obtained by multiplying the input data D by −8.

Thus, by performing multiplying processes using multiplicators of +5 and −7 by combining the multiplying process of the power of 2 by a bit shift with the adding process, the multiplier 12-2 can be configured only by tri-state buffers and an adder, thereby simplifying the configuration.

Figure 14:
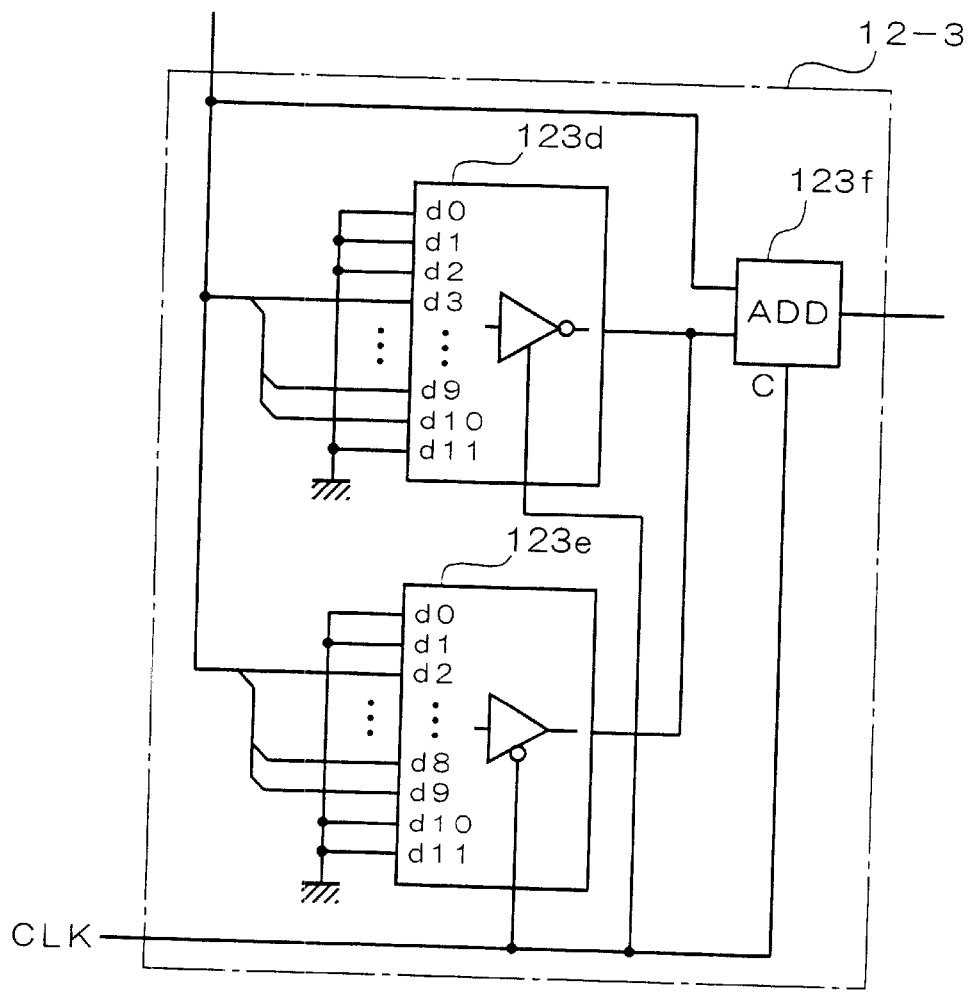
FIG. 14 is a diagram showing a detailed configuration of the multiplier.

In addition, the multiplier 12-3 comprises a tri-state buffer 123d having an inverting output terminal, a tri-state buffer 123e having a non-inverting output terminal, and an adder (ADD) 123f having two input terminals and a carry terminal C as shown in FIG. 14.

When the clock signal CLK inverted and input to the control terminal indicates a high level (in the first half of one clock period), the tri-state buffer 123d shifts and outputs the input data to a higher bit by three bits, and outputs the data after inverting each bit of the shifted data, thereby performing a multiplying process by a multiplicator of −8. Actually, by obtaining a complement by adding 1 after inverting each bit, a multiplying process can be performed using a multiplicator of −8. The process of adding 1 is performed by the adder 123f at the subsequent stage.

When the clock signal CLK inverted and input to the control terminal indicates a low level (in the second half of one clock period), the tri-state buffer 123e shifts the input data to a higher bit by two bits, and outputs the shifted data, thereby performing a multiplying process by a multiplicator of +4.

The adder 123f adds the input data before the multiplication to the multiplication result output from any of the two tri-state buffers 123d and 123e, and further adds 1 corresponding to the carry when the clock signal CLK input to the carry terminal C indicates a high level (in the first half of one clock period).

As described above, the addition of 1 corresponding to the carry is performed to obtain a complement using the tri-state buffer 123e.

Since the operation of only the tri-state buffer 123d is valid in the first half of one clock period in the multiplier 12-3 with the above mentioned configuration, the adder 123f outputs a sum (−8D+D=−7D) obtained by adding the input data D to the multiplication result (−8D) obtained by multiplying the input data D by −8. In the second half of one clock period, since the operation of only the other tri-state buffer 123e is valid, the adder 123f outputs a sum (+4D+D=+5D) obtained by adding the input data D to the multiplication result (+4D) obtained by multiplying the input data D by +4.

Thus, by performing multiplying processes using multiplicators of −7 and +5 by combining the multiplying process of the power of 2 by a bit shift with the adding process, the multiplier 12-3 can be configured only by tri-state buffers and an adder, thereby simplifying the configuration.

Figure 15:
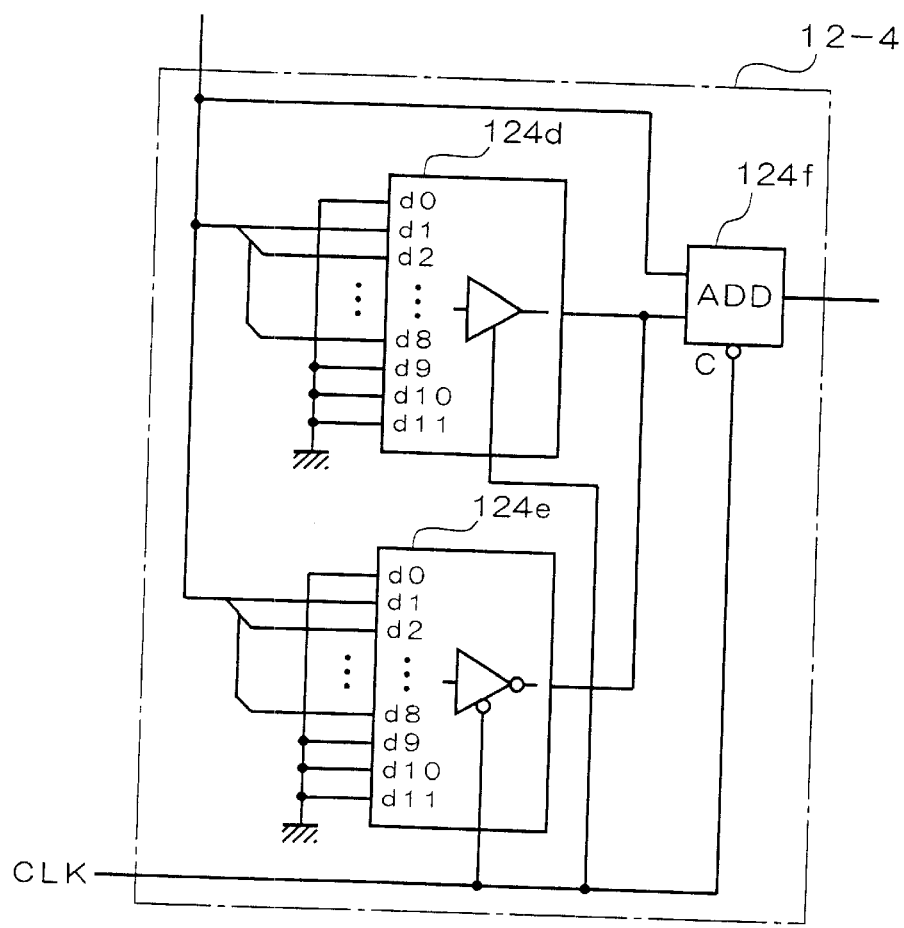
FIG. 15 is a diagram showing a detailed configuration of the multiplier.

In addition, the multiplier 12-4 comprises a tri-state buffer 124d having a non-inverting output terminal, a tri-state buffer 124e having an inverting output terminal, and an adder (ADD) 124f having two input terminals and a carry terminal C as shown in FIG. 15.

When the clock signal input to the control terminal indicates a high level (in the first half of one clock period), the tri-state buffer 124d shifts the input data to a higher bit by one bit, and outputs the shifted data, thereby performing a multiplying process by a multiplicator of 2.

When the clock signal CLK inverted and input to the control terminal indicates a low level (in the second half of one clock period), the tri-state buffer 124e shifts the input data to a higher bit by one bit, and outputs the data after inverting each bit of the shifted data, thereby performing a multiplying process by a multiplicator of −2. Actually, by obtaining a complement by adding 1 after inverting each bit, a multiplying process can be performed using a multiplicator of −2. The process of adding 1 is performed by the adder 124f at the subsequent stage.

The adder 124f adds the input data before the multiplication to the multiplication result output from any of the two tri-state buffers 124d and 124e, and further adds 1 corresponding to the carry when the clock signal CLK inverted and input to the carry terminal C indicates a low level (in the second half of one clock period). As described above, the addition of 1 corresponding to the carry is performed to obtain a complement using the tri-state buffer 124e.

Since the operation of only the tri-state buffer 124d is valid in the first half of one clock period in the multiplier 12-4 with the above mentioned configuration, the adder 124f outputs a sum (+2D+D=+3D) obtained by adding the input data D to the multiplication result (+2D) obtained by multiplying the input data D by +2. In the second half of one clock period, since the operation of only the other tri-state buffer 124e is valid, the adder 124f outputs a sum (−2D+D=−D) obtained by adding the input data D to the multiplication result (−2D) obtained by multiplying the input data D by −2.

Thus, by performing multiplying processes using multiplicators of +3 and −1 by combining the multiplying process of the power of 2 by a bit shift with the adding process, the multiplier 12-4 can be configured only by tri-state buffers and an adder, thereby simplifying the configuration.

The present invention is not limited to the above mentioned embodiment, and various types of embodiments can be set within the scope of the gist of the present invention. For example, according to the above mentioned embodiment, a sampling function is defined as a function of local support differentiable only once in the whole range, but the times of differentiation can be set to a value equal to or larger than 2. In this case, the number of integrating circuits is to match the number of times of differentiation.

The sampling function of this embodiment converges to zero at t=±2, as shown in FIG. 1, but may converge to zero at t=±3 or beyond. For example, in a case of the sampling function converging to zero at t=3, six D flip-flops and six multipliers may be contained in the D/A converter shown in FIG. 5, to generate an analog voltage connecting smoothly six digital data by performing an interpolation process for the digital data.

Furthermore, it is not limited to the interpolating process using a sampling function of local support, but using a sampling function differentiable finite times having a predetermined value in the range from −∞ to +∞, an interpolation process may be performed only for plural digital data corresponding to finite sample position. For example, if such a sampling function is defined by a quadratic piecewise polynomial, a predetermined step function waveform can be obtained by differentiating each piecewise polynomial twice. A voltage is combined using this step function waveform, and a resulting voltage is integrated twice to get an analog signal connecting smoothly the voltages corresponding to the digital data.

INDUSTRIAL APPLICABILITY

As described above, according to the present invention, the multiplication results corresponding to sequentially input plural pieces of digital data are added up, and then the addition result is converted into an analog voltage and integrated, thereby obtaining continuously changing analog signals. As a result, it is not necessary to use a low pass filter to obtain a final analog signal, a group delay characteristic is not deteriorated by different phase characteristics depending on the applicable signal frequencies, and therefore an output waveform can be obtained with less distortion. As compared with the conventional method used with oversampling, the cost of parts can be reduced because it is not necessary to speed up the operations of the parts and to use expensive parts.

What is claimed is:

1. A digital-to-analog converter, characterized by comprising:

a plurality of data holding unit for holding plural pieces of digital data input at predetermined intervals;

a plurality of multiplying unit for receiving said digital data held in each of said plurality of data holding unit, and performing a multiplying process using different multiplicators between a first half and a second half of a data holding period;

an adding unit for performing a process of adding up multiplication results of said plurality of multiplying unit;

a stepwise voltage waveform generation unit for generating a stepwise analog voltage corresponding to the digital data obtained by said adding unit; and an integrating unit for performing analog integration plural times on the analog voltage generated by said stepwise voltage waveform generation unit.

2. A digital-to-analog converter, characterized by comprising:

a plurality of data holding unit for holding plural pieces of digital data input at predetermined intervals;

a plurality of multiplying unit for receiving said digital data held in each of said plurality of data holding unit, and performing a multiplying process using different multiplicators between a first half and a second half of a data holding period;

an adding unit for performing a process of adding up multiplication results of said plurality of multiplying unit;

a stepwise voltage waveform generation unit for generating a stepwise analog voltage corresponding to the digital data obtained by said adding unit; and an integrating unit for performing analog integration plural times on the analog voltage generated by said stepwise voltage waveform generation unit, characterized in that each of the multiplicators used in the multiplying processes by said plurality of multiplying unit corresponds to each of the values of step functions obtained by differentiating plural times piecewise polynomials for a predetermined sampling function configured by the piecewise polynomials.

3. The digital-to-analog converter according to claim 2, wherein said step function comprises a positive region and a negative region set to have an equal area.

4. The digital-to-analog converter according to claim 3, wherein said sampling function is differentiable only once over the whole range and has values of local support.

5. The digital-to-analog converter according to claim 2, characterized in that said step function consists of eight piecewise sections in equal width with a weight of −1, +3, +5, −7, −7, +5, +3, and −1 in a predetermined range corresponding to said five digital data arranged at an equal interval, and that every two of the eight weight coefficients are set as the multiplicators in each of said plurality of multiplying unit.

6. The digital-to-analog converter according to claim 5, characterized in that a multiplying process performed in each of said plurality of multiplying unit is realized by adding said digital data to an operation result of an exponentiation of 2 by a bit shift.

7. A digital-to-analog converter, characterized by comprising:

a plurality of data holding unit for holding plural pieces of digital data input at predetermined intervals;

a plurality of multiplying unit for receiving said digital data held in each of said plurality of data holding unit, and performing a multiplying process using different multiplicators between a first half and a second half of a data holding period;

an adding unit for performing a process of adding up multiplication results of said plurality of multiplying unit;

a stepwise voltage waveform generation unit for generating a stepwise analog voltage corresponding to the digital data obtained by said adding unit; and an integrating unit for performing analog integration plural times on the analog voltage generated by said stepwise voltage waveform generation unit, characterized in that times of said analog integration is two, and an analog signal whose voltage level changes like a quadric function is output from said integrating unit.

8. A digital-to-analog converter, characterized by comprising:

a plurality of data holding unit for holding plural pieces of digital data input at predetermined intervals;

a plurality of multiplying unit for receiving said digital data held in each of said plurality of data holding unit, and performing a multiplying process using different multiplicators between a first portion of a data holding period and a second portion of the data holding period;

an adding unit for performing a process of adding up multiplication results of said plurality of multiplying unit;

a stepwise voltage waveform generation unit for generating a stepwise analog voltage corresponding to the digital data obtained by said adding unit; and an integrating unit for performing analog integration plural times on the analog voltage generated by said stepwise voltage waveform generation unit.

9. The digital-to-analog converter according to claim 8, characterized in that each of the multiplicators used in the multiplying processes by said plurality of multiplying unit corresponds to each of the values of step functions obtained by differentiating plural times piecewise polynomials for a predetermined sampling function configured by the piecewise polynomials.

10. The digital-to-analog converter according to claim 9, wherein said step function comprises a positive region and a negative region set to have an equal area.

11. The digital-to-analog converter according to claim 10, wherein said sampling function is differentiable only once over the whole range and has values of local support.

12. The digital-to-analog converter according to claim 9, characterized in that said step function consists of eight piecewise sections in equal width with a weight of −1, +3, +5, −7, −7, +5, +3, and −1 in a predetermined range corresponding to said five digital data arranged at an equal interval, and that every two of the eight weight coefficients are set as the multiplicators in each of said plurality of multiplying unit.

13. The digital-to-analog converter according to claim 12, characterized in that a multiplying process performed in each of said plurality of multiplying unit is realized by adding said digital data to an operation result of an exponentiation of 2 by a bit shift.

14. The digital-to-analog converter according to claim 8, characterized in that times of said analog integration is two, and an analog signal whose voltage level changes like a quadric function is output from said integrating unit.

* * * * *